(12) United States Patent
Homyk et al.

(10) Patent No.: US 9,406,823 B2
(45) Date of Patent: Aug. 2, 2016

(54) METHODS FOR FABRICATING SELF-ALIGNING SEMICONDUCTOR HETEREOSTRUCTURES USING NANOWIRES

(71) Applicant: CALIFORNIA INSTITUTE OF TECHNOLOGY, Pasadena, CA (US)

(72) Inventors: Andrew P. Homyk, South Pasadena, CA (US); Michael D. Henry, Altadena, CA (US); Axel Scherer, Barnard, VT (US); Sameer Walavalkar, Studio City, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 14/329,748

(22) Filed: Jul. 11, 2014

(65) Prior Publication Data

US 2014/0319459 A1    Oct. 30, 2014

Related U.S. Application Data

(62) Division of application No. 12/949,758, filed on Nov. 18, 2010, now Pat. No. 8,809,093.

(60) Provisional application No. 61/262,843, filed on Nov. 19, 2009.

(51) Int. Cl.
*H01L 29/06* (2006.01)
*H01L 31/0352* (2006.01)
*B82Y 10/00* (2011.01)
(Continued)

(52) U.S. Cl.
CPC ........ *H01L 31/035227* (2013.01); *B82Y 10/00* (2013.01); *B82Y 40/00* (2013.01); *H01L 21/0243* (2013.01); *H01L 21/0259* (2013.01); *H01L 21/02381* (2013.01); *H01L 21/02521* (2013.01); *H01L 21/02639* (2013.01); *H01L 29/0665* (2013.01); *H01L 29/0676* (2013.01); *H01L 29/127* (2013.01); *H01L 29/413* (2013.01); *H01L 29/66439* (2013.01);
(Continued)

(58) Field of Classification Search
CPC .............................................. H01L 31/035227
USPC ........ 977/938, 763–765, 774; 257/94; 438/47
See application file for complete search history.

(56) References Cited

U.S. PATENT DOCUMENTS

| 4,322,571 A | 3/1982 | Stanbery |
| 6,586,787 B1 | 7/2003 | Shih et al. |

(Continued)

FOREIGN PATENT DOCUMENTS

| JP | H06045613 | 2/1994 |
| JP | 2006505119 | 5/2004 |

(Continued)

OTHER PUBLICATIONS

Non-Final Office Action mailed on Oct. 24, 2012 for U.S. Appl. No. 12/952,181, filed Nov. 22, 2010 in the name of Andrew P. Homyk et al.

(Continued)

*Primary Examiner* — Peter Bradford
(74) *Attorney, Agent, or Firm* — Steinfl & Bruno LLP

(57) ABSTRACT

Methods for fabricating self-aligned heterostructures and semiconductor arrangements using silicon nanowires are described.

11 Claims, 6 Drawing Sheets

(51) Int. Cl.

| | | |
|---|---|---|
| *H01L 29/66* | (2006.01) | |
| *H01L 29/775* | (2006.01) | |
| *H01L 33/06* | (2010.01) | |
| *B82Y 40/00* | (2011.01) | |
| *H01L 29/12* | (2006.01) | |
| *H01L 29/41* | (2006.01) | |
| *H01L 21/02* | (2006.01) | |
| *H01L 29/267* | (2006.01) | |

(52) U.S. Cl.
CPC ............. *H01L29/775* (2013.01); *H01L 33/06* (2013.01); *H01L 29/267* (2013.01); *Y10S 977/762* (2013.01)

(56) References Cited

U.S. PATENT DOCUMENTS

| | | | |
|---|---|---|---|
| 6,593,065 | B2 | 7/2003 | Scherer |
| 6,713,238 | B1 | 3/2004 | Chou et al. |
| 6,831,017 | B1 | 12/2004 | Li et al. |
| 7,019,325 | B2 | 3/2006 | Li et al. |
| 7,230,286 | B2 | 6/2007 | Cohen et al. |
| 7,302,146 | B2 | 11/2007 | Turner et al. |
| 7,387,967 | B2 | 6/2008 | Ogawa et al. |
| 7,419,908 | B2 | 9/2008 | Green |
| 7,622,394 | B2 | 11/2009 | Ikegami |
| 7,906,803 | B2 | 3/2011 | Shioya et al. |
| 7,947,430 | B2 | 5/2011 | Fu et al. |
| 7,998,788 | B2 | 8/2011 | Guha et al. |
| 8,067,763 | B2 | 11/2011 | Wang et al. |
| 8,080,468 | B2 | 12/2011 | Scherer et al. |
| 8,114,774 | B2 | 2/2012 | Hurkx et al. |
| 8,154,093 | B2 | 4/2012 | Bradley et al. |
| 8,183,587 | B2 | 5/2012 | Samuelson et al. |
| 8,198,706 | B2 | 6/2012 | Kamins et al. |
| 8,557,612 | B2 | 10/2013 | Henry et al. |
| 8,557,613 | B2 | 10/2013 | Shearn et al. |
| 8,569,741 | B2 | 10/2013 | Scherer et al. |
| 9,005,548 | B2 | 4/2015 | Henry et al. |
| 9,234,872 | B2 | 1/2016 | Homyk et al. |
| 2002/0127495 | A1 | 9/2002 | Scherer |
| 2003/0010971 | A1* | 1/2003 | Zhang ............... B82Y 10/00 257/15 |
| 2004/0071951 | A1 | 4/2004 | Jin |
| 2004/0108298 | A1 | 6/2004 | Gao |
| 2005/0279989 | A1 | 12/2005 | Li et al. |
| 2006/0063368 | A1 | 3/2006 | Sharma |
| 2006/0088995 | A1 | 4/2006 | Zhang et al. |
| 2006/0118975 | A1 | 6/2006 | Koenenkamp |
| 2006/0131695 | A1 | 6/2006 | Kuekes et al. |
| 2006/0207647 | A1 | 9/2006 | Tsakalakos et al. |
| 2006/0223324 | A1 | 10/2006 | Ikegami |
| 2006/0273389 | A1 | 12/2006 | Cohen et al. |
| 2007/0126079 | A1 | 6/2007 | Shioya et al. |
| 2007/0132043 | A1 | 6/2007 | Bradley et al. |
| 2007/0178477 | A1 | 8/2007 | Joiner, Jr. et al. |
| 2008/0009121 | A1* | 1/2008 | Wei ............... 438/406 |
| 2008/0035983 | A1 | 2/2008 | Sandhu et al. |
| 2008/0036038 | A1 | 2/2008 | Hersee et al. |
| 2008/0092938 | A1 | 4/2008 | Majumdar et al. |
| 2008/0102319 | A1 | 5/2008 | Bratkovski et al. |
| 2008/0142970 | A1 | 6/2008 | Evans et al. |
| 2008/0149944 | A1* | 6/2008 | Samuelson ............ B82Y 10/00 257/88 |
| 2008/0156369 | A1 | 7/2008 | Ko et al. |
| 2008/0203431 | A1 | 8/2008 | Bonaventura et al. |
| 2008/0211040 | A1 | 9/2008 | Lieber et al. |
| 2008/0224115 | A1 | 9/2008 | Bakkers et al. |
| 2008/0230802 | A1* | 9/2008 | Bakkers et al. ........ 257/190 |
| 2009/0028493 | A1 | 1/2009 | Fattal et al. |
| 2009/0203214 | A1 | 8/2009 | Hurkx et al. |
| 2010/0006817 | A1 | 1/2010 | Ohlsson et al. |
| 2010/0019355 | A1* | 1/2010 | Kamins et al. ........ 257/627 |
| 2010/0033561 | A1 | 2/2010 | Hersee |
| 2010/0065941 | A1 | 3/2010 | Wells et al. |
| 2010/0068828 | A1 | 3/2010 | Thomas et al. |
| 2010/0176822 | A1 | 7/2010 | Offermans et al. |
| 2010/0176855 | A1 | 7/2010 | Huffman et al. |
| 2010/0213579 | A1 | 8/2010 | Henry et al. |
| 2010/0215543 | A1 | 8/2010 | Henry et al. |
| 2010/0291385 | A1 | 11/2010 | Greer et al. |
| 2011/0020960 | A1 | 1/2011 | Henry et al. |
| 2011/0031470 | A1 | 2/2011 | Scherer et al. |
| 2011/0165724 | A1 | 7/2011 | Guha et al. |
| 2011/0169012 | A1* | 7/2011 | Hersee et al. ........ 257/76 |

FOREIGN PATENT DOCUMENTS

| | | |
|---|---|---|
| JP | 2004/193525 | 7/2004 |
| JP | 2005197612 | 7/2005 |
| JP | 2006/332662 | 12/2006 |
| JP | 2007520877 | 7/2007 |
| JP | 2007/194646 | 8/2007 |
| JP | 2008130712 | 6/2008 |
| JP | 2010535406 | 1/2009 |
| WO | 00/21118 | 4/2000 |
| WO | 2005/064664 A1 | 7/2005 |
| WO | 2005/076381 | 8/2005 |
| WO | 2007/022359 A2 | 2/2007 |
| WO | 2007/077842 | 7/2007 |
| WO | 2007/077842 A2 | 7/2007 |
| WO | 2008/034823 A1 | 3/2008 |
| WO | 2008/129478 | 10/2008 |
| WO | 2009017604 | 1/2009 |
| WO | 2010/099216 | 9/2010 |
| WO | 2010/099220 | 9/2010 |
| WO | 2010/151604 | 12/2010 |

OTHER PUBLICATIONS

Final Office Action mailed on Apr. 7, 2014 for U.S. Appl. No. 12/952,181, filed Nov. 22, 2010 in the name of Andrew P. Homyk et al.

Advisory Action mailed on Jun. 25, 2014 for U.S. Appl. No. 12/952,181, filed Nov. 22, 2010 in the name of Andrew P. Homyk et al.

Notice of Allowance mailed on May 20, 2014 for U.S. Appl. No. 12/949,758, filed Nov. 18, 2010 in the name of Andrew P. Homyk et al.

Restriction Requirement mailed on Aug. 29, 2012 for U.S. Appl. No. 12/949,758, filed Nov. 18, 2010 in the name of Andrew P. Homyk et al.

Non-Final Office Action mailed on Sep. 19, 2012 for U.S. Appl. No. 12/949,758, filed Nov. 18, 2010 in the name of Andrew P. Homyk et al.

Final Office Action mailed on Mar. 4, 2013 for U.S. Appl. No. 12/949,758, filed Nov. 18, 2010 in the name of Andrew P. Homyk et al.

Non-Final Office Action mailed on Jun. 19, 2013 for U.S. Appl. No. 12/949,758, filed Nov. 18, 2010 in the name of Andrew P. Homyk et al.

Final Office Action mailed on Oct. 17, 2013 for U.S. Appl. No. 12/949,758, filed Nov. 18, 2010 in the name of Andrew P. Homyk et al.

Extended EP Search Report issued for EP Application No. 10792619.8 in the name of California Institute of Technology. Mail date: Jun. 2, 2014. 6 pages.

Japanese Office Action issued for JP Application No. 2012-517704 in the name of K. Sugimura et al. mail date: Aug. 7, 2014. 6 pages.

Notice of Allowance mailed on Jun. 20, 2013 for U.S. Appl. No. 13/159,335, filed Jun. 13, 2011 in the name of Michael Shearn et al. 11 pages.

Henry, M., et al., Alumina etch masks for fabrication of high-aspect-ratio silicon micropillars and naopillars, Nanotechnology 2009, 20: 255305-1-255305-4.

Hon, K., et al., Periodically Poled Silicon, Applied Physics Letters 2009, 94: 091116-1 091116-3.

Non-Final Office Action issued for U.S. Appl. No. 12/712,097, filed Feb. 24, 2010 in the name of Michael D. Henry et al. mail date: Oct. 7, 2011. 17 pages.

(56) References Cited

OTHER PUBLICATIONS

Oxford Plama Technology Applications Engineering Group "Plasmalab" Process Data Sheet, Bosch Silicon Etch Process, Cryo Silicon Etch Process, and Silicon Etch Process (2002) 1 page.

PCT International Search Report issued for PCT Application PCT/US2010/057301 filed on Nov. 18, 2010 in the name of California Institute of Technology et al. 4 pages.

PCT Written Opinion issued for PCT Application PCT/US2010/057301 filed on Nov. 18, 2010 in the name of California Institute of Technology et al., mail date: Jun. 24, 2011. 6 pages.

Advisory Action mailed on Jun. 25, 2014 for U.S. Appl. No. 12/952,181, filed Nov. 22, 2010 in the name of California Institute of Technology. 5 pages.

Gao, L., et al., The "lotus effect" explained: Two reasons why two length scales of topography are important, Langmuir 2006, 22: 2966-2967.

Gates, B., et al., New Approaches to Nanofabrication: Molding, Printing, and Other Techniques, Chemical Reviews 2005, 105: 1171-1196.

International Search Report for PCT/US2010/025256 filed on Feb. 24, 2010 in the name of California Institute of Technology, mail date: Oct. 19, 2010. 4 pages.

International Search Report for PCT/US2010/025261 filed on Feb. 24, 2010 in the name of California Institute of Technology, mail date: Oct. 20, 2010. 4 pages.

International Search Report for PCT/US2010/039702 filed on Jun. 23, 2010 in the name of California Institute of Technology et al., mail date: Feb. 24, 2011. 4 pages.

Li, H. et al., Investigation of capacitive humidity sensing bahvior of silicon nanowires, Physica E 2009, vol. 41, pp. 600-604.

Melngailis, J., et al., A Review of Ion Projection Lithography, Journal of Vacuum Science Technology B 1998, 16: 927-957.

Mosher, L. et al., Double-Exposure Grayscale Photolithography, Journal of Microelectromechanical Systems 2009, 18: 308-315.

Notice of Allowance issued for U.S. Appl. No. 12/711,992, filed Feb. 24, 2010 in the name of Henry, M.D. et al., mail date: Jan. 27, 2012. 9 pages.

Notice of Allowance mailed on Aug. 12, 2013 for U.S. Appl. No. 13/286,008, filed Oct. 31, 2011 in the name of Walavalkar et al. 8 pages.

PCT Written Opinion for PCT/US2010/039702 filed on Jun. 23, 2010 in the name of California Institute of Technology et al., mail date: Feb. 24, 2011. 7 pages.

Written Opinion for PCT/US2010/025256 filed on Feb. 24, 2010 in the name of California Institute of Technology, mail date: Oct. 19, 2010. 5 pages.

Written Opinion for PCT/US2010/025261 filed on Feb. 24, 2010 in the name of California Institute of Technology, mail date: Oct. 20, 2010. 7 pages.

Kayes, B.M. et al., Comparison of the device physics principles of planar and radial p-n junction nanorod solar cells, *J. Appl. Phys* 97, 114302-11 (2005).

Moser, B., et al., Strength and Fracture of Si Micropillars: A new scanning electron microscopy-based micro-compression test, Journal of Material Resources 2007, 22: 1004-1011.

Notice of Allowance issued for U.S. Appl. No. 12/822,109, filed Jun. 23, 2010 in the name of Axel Scherer et al., mail date: May 23, 2011. 10 pages.

Notice of Allowance issued for U.S. Appl. No. 12/822,109, filed Jun. 23, 2010 in the name of Axel Scherer mail date: Sep. 12, 2011. 6 pages.

Advisory Action for U.S. Appl. No. 12/712,097, filed Feb. 24, 2010 in the name of Michael Henry et al. Mail Date: Dec. 6, 2012. 7 pages.

Advisory Action mailed on Nov. 2, 2012 for U.S. Appl. No. 12/712,097, filed Feb. 24, 2010 in the name of Michael D. Henry et al. 4 pages.

Ambrose, D., et al., Vapour pressures up to their critical temperatures of normal alkanes and 1-alkanois, Pure & Applied Chemistry 1989, 61: 1395-1403.

Barrett, C.S., et al., Lattice Constants of Gallium at 297 K, Nature 1965, 207: 1382.

Bogglid, P., et al., Fabrication and Actuation of Customized Nanotweezers with a 25 nm Gap, Nanotechnology 2001, 12: 331-335.

Cassie, A., et al., Wettability of Porous Surfaces, Trans. of Faraday Soc. 1944, 40: 346-351.

Chang, Y.F., et al., Fabrication of High-aspect-ratio Silicon Nanopillar Arrays with the Conventional Reactive Ion Etching Technique, Applied Physics A 2007, 86: 193-196.

Chekurov, N., et al., The Fabrication of Silicon Nanostructures by Local Gallium Implantation and Cryogenic Deep Reactive Ion Etching, Nanotechnology 2009, 20: 065307-1-065307-5.

Chirico, R., et al., Vapor pressure on-Alkanes revisted. New high-precision vapor pressure data on n-Decane, n-Elcosane, and n-Octacosane, J. Chem. Eng. Data 1989, 34: 149-156.

Ebron, V., et al., Fuel-powered artificial muscles, Science 2006, 311: 1580-1584.

Eichenfield, M., et al., Optomechanical crystals, Nature 2009, 462: pp. 78-2.

Ekinci, KL, et al., Nanoelectromechanical systems, Review of Scientific Instruments 2005, 76:061101-1-061101-12.

Final Office Action for U.S. Appl. No. 12/712,097, filed Feb. 24, 2010 in the name of Michael Henry et al. Mail Date: Jul. 30, 2012. 15 pages.

Final Office Action mailed on Mar. 19, 2013 for U.S. Appl. No. 12/952,181, filed Nov. 22, 2010 in the name of Homyk et al. 12 pages.

Hashemi, P., et al., Asymmetric Strain in Nanoscale Patterned Strained-Si/strained-Ge/strained-Si Heterostructures on Insulator, Applied Physics Letters 2007, 91: 083109-1 083109-3.

Hoshikawa, T. et al., Relationship between Gallium Concentration and Resistivity of Gallium-Doped Czochralski Silicon Crystals: Investigation of a Conversion Curve, Japanese J. Appl. Phys. 2008, 47: pp. 8691-8695.

Kelzenberg, M.D., et al., Single-nanowire Si Solar Cells, pp. 1-6.

Kim, H., et al., Field Emission From a Single Nanomechanical Pillar, Nanotechnology 2007, 18: 065201-1-065201-4.

Kuan, W., et al., The Preparation of Superhydrophobic Surfaces of Hierarchical Silicon Nanowire Structures, Nanotechnology 2009, 20: 035605-1-035605-8.

Non-Final Office Action issued for U.S. Appl. No. 12/711,992, filed Feb. 24, 2010 in the name of Michael D. Henry et al. mail date: Oct. 17, 2011. 10 pages.

Non-Final Office Action mailed on Mar. 28, 2013 for U.S. Appl. No. 13/159,335, filed Jun. 13, 2011 in the name of Michael Shearn et al. 13 pages.

Non-Final Office Action mailed on May 7, 2013 for U.S. Appl. No. 13/286,008, filed Oct. 31, 2011 in the name of Walavalkar et al. 13 pages.

Notice of Allowance issued for U.S. Appl. No. 12/822,109, filed Jun. 23, 2010 in the name of Axel Scherer et al. mail date: May 23, 2011. 11 pages.

Notice of Allowance issued for U.S. Appl. No. 12/822,109, filed Jun. 23, 2010 in the name of Axel Scherer et al. mail date: Sep. 12, 2011. 6 pages.

PCT International Search Report issued for PCT Application PCT/US10/39702 filed on Jun. 23, 2010 in the name of California Institute of Technology et al. 4 pages.

Qian, H.X., et al., Fabrication of Si Microstructures Using Focused Ion Beam Implantation and Reactive Ion Etching, Journal of Micromechanics and Microengineering 2008, 18: 035003-1-035003-5.

Rangelow, I.W., et al., Critical Tasks in High Aspect Ratio Silicon Dry Etching for Microelectromechanical Systems, Journal of Vaccum Science Technology A 2003, 21: 1150-1562.

Restriction Requirement for U.S. Appl. No. 12/712,097, filed Feb. 24, 2010 in the name of Michael Henry et al. Mail Date: May 1, 2012. 6 pages.

Restriction Requirement issued for U.S. Appl. No. 12/712,097, filed Feb. 24, 2010 in the name of Michael D. Henry et al. mail date: Jul. 13, 2011. 5 pages.

(56) References Cited

OTHER PUBLICATIONS

Restriction Requirement issued for U.S. Appl. No. 12/822,109, filed Jun. 23, 2010 in the name of Axel Scherer mailed date: Mar. 30, 2011. 6 pages.
Restriction Requirement mailed on Jan. 10, 2013 for U.S. Appl. No. 13/159,335, filed Jun. 13, 2011 in the name of Michael Shearn et al. 5 pages.
Restriction Requirement mailed on Oct. 17, 2012 for U.S. Appl. No. 12/824,128, filed Jun. 25, 2010 in the name of Michael D. Henry et al. 5 pages.
Sainiemi, L., et al., Mask Material Effects in Cryogenic Deep Reactive Ion Etching, Journal of Vacuum Science Technology B 2007, 25: 801-807.
Sainiemi, L., et al., Rapid Fabrication of High Aspect Ratio Silicon Nanopillars for Chemical Analysis, Nanotechnology 2007, 18: 505303-1 505303-7.
Sajjad, R., et al., Electronic Properties of a Strained <100> Silicon Nanowire, Journal of Applied Physics 2009, 105: 044307-1 044307-6.
Scheible, D., et al., Silicon Nanopillars for Mechanical Single-electron Transport, Applied Physics Letters 2004, 84: 4632-4634.
Schmidt, B., et al., Etch Rate Retardation of Ga$^+$-Ion Beam-Irradiated Silicon, Journal of the Electrochemical Society 2005, 152: G875-G879.
Schmidt, B., et al., Writing FIB Implantation and Subsequent Anisotropic Wet Chemical Etching for Fabrication of 3D Structures in Silicon, Sensors and Actuators A: Physical 1997, 61: 369-373.
Sievila, P. et al., The fabrication of silicon nanostructures by focused-ion-beam implantation and TMAH wet etching, Nanotechnology 2010, 21: 145301-1-145301-6.
Singh, J., Electronic and Optoelectronic Properties of Semiconductor Structures, In Electronic and Optoelectronic Properties of Semiconductor Structures, 2003, Cambridge University Press, Chapter 1.4 Strained heterostructures, 26-31.
Singh, N., et al., High-Performance Fully Depleted Silicon Nanowire (Diameter ≤ 5 nm) Gate-All-Around CMOS Devices, IEEE Electron Device Letters 2006, 27:383-386.
Sunkara, M.K., et al., Bulk Synthesis of Silicon Nanowires Using a Low-Temperature Vapor-Liquid-Solid Method, Applied Physics Letters 2001, 79: 1546-1548.
Tachi, S. et al., Low-temperature reactive ion etching and microwave plasma etching of silicon, Appl. Phys. Letters 1988, 52: 616-618.
Tang, Z., et al., Finite Temperature Quasicontinuum Method for Multiscale Analysis of Silicon Nanostructures, Physical Review 2006, 74: 064100-1 061400-29.
Teh, W., et al., Cross-linked PMMA as a low Dimensional Sacrificial Layer, Journal of Electromechanical Systems 2003, 12: 641-648.
Timoshenko, S., Analysis of Bi-metal Thermostats, Journal of the Optical Society of America 1925, 11: 233-255.
Tseng, A., Milling of Submicron Channels on Gold Layer Using Double Charged Arsenic Ion Beam, Journal of Vacuum Science & Technology B: Microelectronics and Nanostructures 2004, 22: 82-89.
Tseng, A., Recent Developments in Micromilling Using Focused Ion Beam Technology, Journal of Micromechanics and Microengineering 2004, 14: R15-R34.
Tseng, A., Recent Developments in Nanofabrication Using Ion Projection Lithography, Small 2005, 1: 594-608.
Watt, F., et al., Ion Beam Lithography and Nanofabrication: A Review, International Journal of Nanoscience 2005, 4: 269-286.
Welch, C.C., et al., Silicon Etch Process Options for Micro-and Nanotechnology Using Inductively Coupled Plasmas, Microelectronic Engineering 2006, 83: 1170-1173.
Wiener, H., Vapor Pressure-Temperature Relationships Among the Branched Paraffin Hydrocarbons, ACS 1948, 425-430.
Williams, K.R., et al., Etch Rates for Micromachining Processing Part, Journal of Microelectromechanical Systems 2003, 12: 761-778.

Yeom, J., et al., Maximum Achievable Aspect Ratio in Deep Reactive Ion Etching of Silicon due to Aspect Ratio Dependent Transport and the Microloading Effect, Journal of Vacuum Science Technology 2005, 23: 2319-2329.
Zailer, I., et al., Crosslinked PMMA as a High-resolution Negative Resist for Elctron Beam Lithography and Applications for Physics of lowdimensional Structures, Seminconductor Sci. Technol. 1996, 11: 1235-1238.
Zhou, Z., et al., Two-Beam-Current Method for E-Beam Writing Gray-Scale Masks and Its Application to High-Resolution Microstructures, Applied Optics 2008, 47: 3177-3184.
Chen, M-H, et al. "Self-masked high-aspect-ratio polymer nanopillars" Nanotechnology 19 (2008) 505301 1-7.
de Boer, M., et al., Guidelines for Etching Silicon MEMS Structures Using Flourine High-density Plasmas at Cryogenic Temperatures, Journal of Microelectromechanical Systems 2002, 11: 385-401.
Final Office Action mailed on Mar. 4, 2013 for U.S. Appl. No. 12/949,758, filed Nov. 18, 2010 in the name of Andrew P. Homyk et al. 16 pages.
Final Office Action mailed on Oct. 17, 2013 for U.S. Appl. No. 12/949,758, filed Nov. 18, 2010 in the name of California Institute of Technology. 10 pages.
PCT International Preliminary on Patentability mailed on Aug. 30, 2011 for PCT application PCT/US2010/025261 filed on Feb. 24, 2010 in the name of California Institute of Technology et al. 8 pages.
Restriction Requirement mailed on Aug. 29, 2012 for U.S. Appl. No. 12/949,758, filed Nov. 18, 2010 in the name of Andrew P. Homyk et al. 6 pages.
Written Opinion mailed on Feb. 24, 2011 for PCT/US2010/039702 filed on Jun. 23, 2010 in the name of California Institute of Technology. 7 pages.
European Communication Pursuant to Rules 70(2) and 70a(2) EPC dated Jun. 20, 2014 for EP Application No. 10792619.8 filed on Jun. 23, 2010 in the name of California Institute of Technology. 1 page.
Frey, L., et al., Nanoscale Effects in Focused Ion Beam Processing, Applied Physics A: Materials Science & Processing 2003, 76: 1017-1023.
Gierak, J., et al., Exploration of the Ultimate Patterning Potential Achievable with High Resolution Focused Ion Beams, Applied Physics A: Materials Science & Processing 2005, 80: 187-194.
Henry, MD et al., Ga+ beam lithography for nanoscale silicon reactive ion etching, Nanotechnology 2010, 21, pp. 1-8.
Jacobsen, R., et al., Strained Silicon as a New Electro-optic Material, Nature 2006, 441: 199-202.
Jansen, H.V., et al., Black Silicon Method X: A Review on High Speed and Selective Plasma Etching of Silicon with Profile Control: An In-Depth Comparison Between Bosch and Cryostat DRIE Processes as a Roadmap to Next Generation Equipment, Journal of Micromechanics and Microengineering 2009, 19: 033001-1-033001-41.
Japanese Office Action mailed on Aug. 19, 2014 for JP Application No. 2012-517704 filed on Feb. 4, 2010 in the name of California Institute of Technology—Japanese with English Translation. 6 pages.
Kato, N.I., et al., Side-wall Damage in a Transmission Electron Microscopy Specimen of Crystalline Si Prepared by Focused Ion Beam Etching, Journal of Vacuum Science Technology A 1999, 17: 1201-1024.
Lauhon, L., et al., Epitaxial Core-shell and Core-multishell Nanowire Heterostructures, Nature 2002, 420: 57-61.
Lugstein, A.et al., FIB processing of silicon in the nanoscale regime, Appl. Phys. A 2003, 76: 545-548.
Marrian, C., et al., Nanofabrication, Journal of Vacuum Science Technology A 2003, 21: S207-S215.
Mellhaoui, X. et al., SiOxFy passivation layer in silicon cryoetching, J. Appl. Phys. 2005, 98: 104901-1-104901-10.
Nassiopoulos, A., et al., Electroluminescent Device Based on Silicon Nanopillars, Applied Physics Letters 1996, 69: 2267-2269.
Non-Final Office Action for U.S. Appl. No. 12/952,181, filed Nov. 22, 2010 in the name of Andrew P. Homyk et al. Mail Date: Oct. 24, 2012. 11 pages.
Non-Final Office Action mailed on Jul. 23, 2013 for U.S. Appl. No. 12/952,181, filed Nov. 22, 2010 in the name of Homyk et al. 15 pages.

(56) References Cited

OTHER PUBLICATIONS

Non-Final Office Action mailed on Jun. 19, 2013 for U.S. Appl. No. 12/949,758, filed Nov. 18, 2010 in the name of California Institute of Technology. 12 pages.
Non-Final Office Action mailed on Sep. 19, 2012 for U.S. Appl. No. 12/949,758, filed Nov. 18, 2010 in the name of Andrew P. Homyk et al. 19 pages.
Notice of Allowance mailed on Apr. 2, 2013 for U.S. Appl. No. 12/824,128, filed Jun. 25, 2010 in the name of Michael D. Henry et al. 9 pages.
Notice of Allowance mailed on Aug. 6, 2013 for U.S. Appl. No. 12/824,128, filed Jun. 25, 2010 in the name of Michael D. Henry et al. 10 pages.
Notice of Allowance mailed on Dec. 23, 2014 for U.S. Appl. No. 12/712,097, filed Feb. 24, 2010 in the name of Michael D. Henry et al. 7 pages.
Notice of Allowance mailed on Jan. 11, 2013 for U.S. Appl. No. 12/824,128, filed Jun. 25, 2010 in the name of Michael D. Henry et al. 12 pages.
Notice of Allowance mailed on Jan. 29, 2015 for U.S. Appl. No. 12/952,181, filed Nov. 22, 2010 in the name of Andrew P. Homyk. 7 pages.
Notice of Allowance mailed on Sep. 20, 2013 for U.S. Appl. No. 13/159,335, filed Jun. 13, 2011 in the name of Michael Shearn et al. 11 pages.
Olesinski, RW et al., The Ga—Si (Gallium—Silicon) System, Bulletin of the Alloy Phase Diagrams 1985, 6: 362-364.

Photopoulos, P., et al. Photoluminescence from Nanocrystalline Silicon in Si/SiO2 Superlattices, Applied Physics Letters 2000, 76: 3588-3590.
Tang, Z., et al., Physical models for coupled electromechanical analysis of silicon nanoelectromechanical systems, Journal of Applied Physics 2005, 97: 114304-1 114304-13.
European Communication Pursuant to Rules 70(2) and 70a(2) EPC for EP Application No. 10832213.2 filed on Nov. 18, 2010 in the name of Axel Scherer et al. Mail Date: Sep. 1, 2015. 1 page.
European Search Report for EPO Application No. EP 10832213.2 filed Nov. 18, 2010 in the name of Axel Scherer et al. Mail Date: Aug. 14, 2014. 8 pages.
Notice of Allowance for U.S. Appl. No. 12/712,097, filed Feb. 24, 2010 on behalf of Michael D. Henry. Mail Date: Aug. 28, 2014. 7 pages.
Non-Final Office Action for U.S. Appl. No. 14/527,039, filed Oct. 29, 2014 on behalf of Michael D. Henry. Mail Date: Nov. 30, 2015. 7 pages.
Notice of Allowance for U.S. Appl. No. 14/527,039, filed Oct. 29, 2014 on behalf of Michael D. Henry. Mail Date: Mar. 14, 2016. 8 pages.
Non-Final Office Action for U.S. Appl. No. 14/673,700, filed Mar. 30, 2015 on behalf of Andrew P. Homyk. Mail Date: Aug. 13, 2015. 18 pages.
Notice of Allowance for U.S. Appl. No. 14/673,700, filed Mar. 30, 2015 on behalf of Andrew P. Homyk. Mail Date: Dec. 3, 2015. 18 pages.

\* cited by examiner

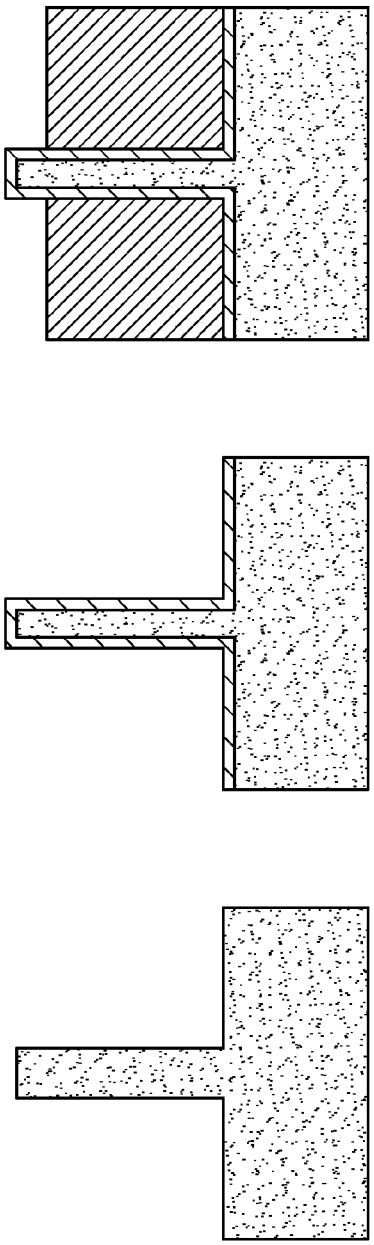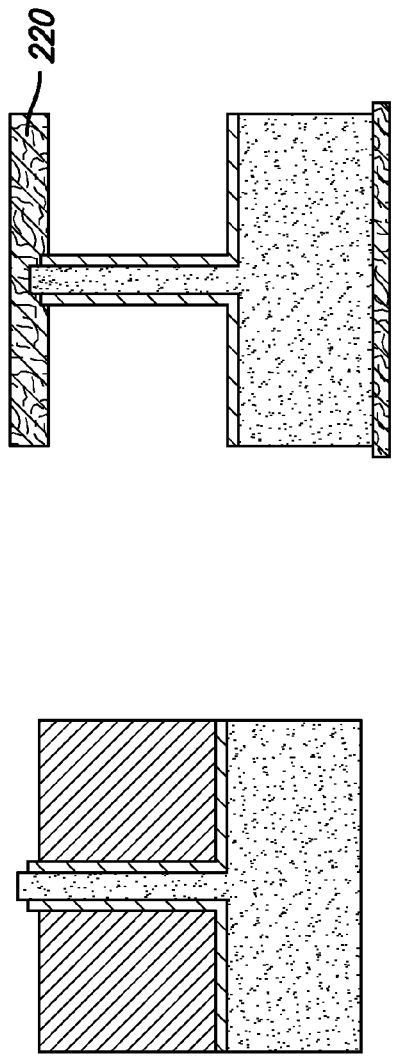

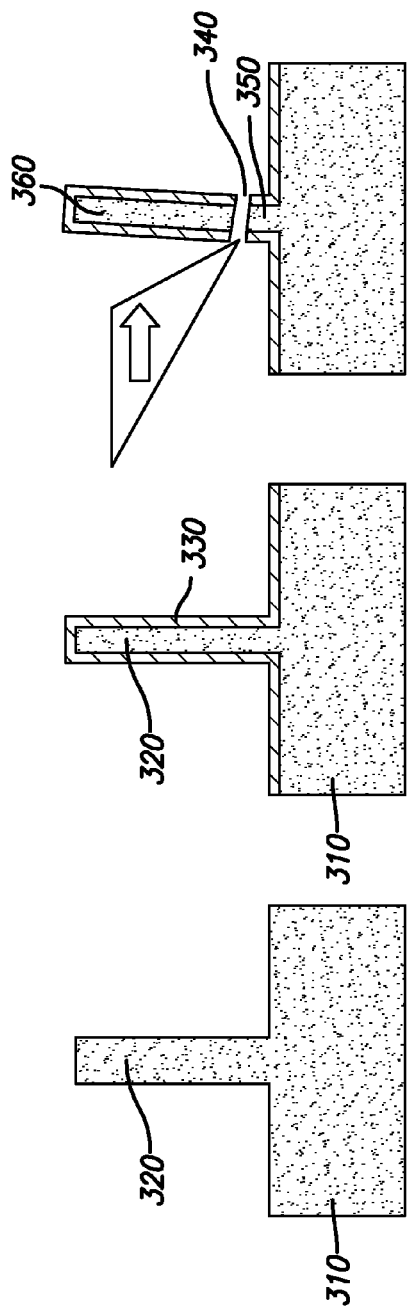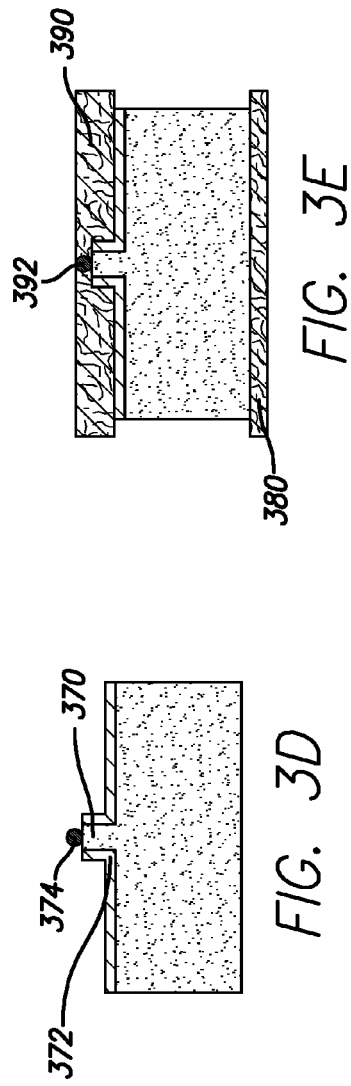

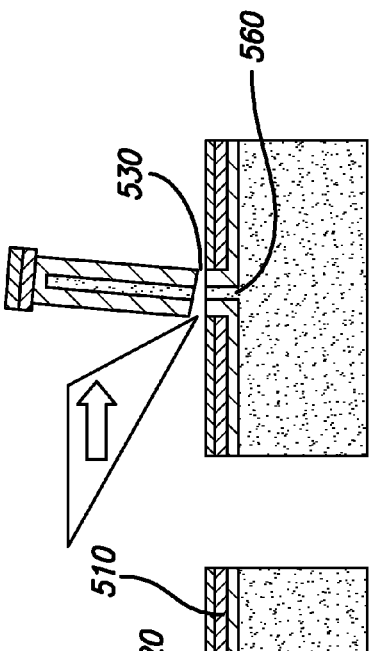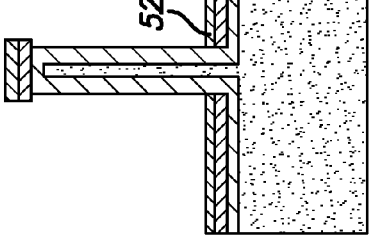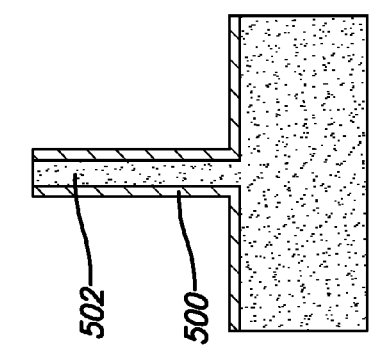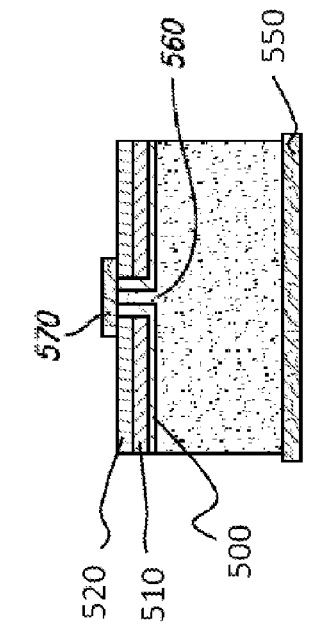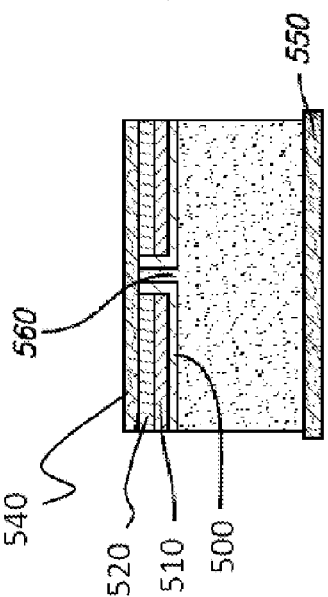

METHODS FOR FABRICATING SELF-ALIGNING SEMICONDUCTOR HETEREOSTRUCTURES USING NANOWIRES

CROSS REFERENCE TO RELATED APPLICATIONS

The present application is a divisional of U.S. application Ser. No. 12/949,758 filed on Nov. 18, 2010, which claims priority to U.S. Provisional Application No. 61/262,843, filed on Nov. 19, 2009 which is incorporated herein by reference in its entirety. The present application may be related to U.S. patent application Ser. No. 12/712,097 for 'Methods for Fabricating High Aspect Ratio Probes and Deforming High Aspect Ratio Nanopillars and Micropillars' filed on Feb. 24, 2010, U.S. patent application Ser. No. 12/824,128 for 'Method for Fabricating Micro and Nanostructures in a Material' filed on Jun. 25, 2010, U.S. patent application Ser. No. 12/711,992 for 'Methods for Fabrication of High Aspect Ratio Micropillars and Nanopillars filed on Feb. 24, 2010, and U.S. patent application Ser. No. 12/822,109 for 'Methods for Fabricating Passivated Silicon Nanowires and Devices Thus Obtained' filed on Jun. 23, 2010, all of which are incorporated herein by reference in their entirety.

STATEMENT OF GOVERNMENT GRANT

This invention was made with government support under Grant No. HR0011-04-1-0054 awarded by the DARPA, Grant No. FA9550-04-1-0434 awarded by the AFSOR and Grant No. W911-NF-07-1-0277 awarded by the ARO. The government has certain rights in this invention.

FIELD

The present disclosure relates to fabrication using silicon nanowires. Moreover, it relates to methods for fabricating self-aligning arrangements on semiconductors.

BACKGROUND

Defining high aspect ratio structures with controllable sidewalls in silicon has become increasingly important both in the nanometer and micrometer scale for solar cells, microelectronic devices, and chemical analysis. High aspect ratio micrometer pillars are used for solar cell investigations while nanometer scale high aspect ratio pillars are enabling fundamental investigations in theories of nanoscale pillar stress mechanics, silicon based lasers, and nanoscale electronic devices such as finFETs. Currently various nanofabrication techniques exist that rely on self assembly or bottom-up processing. Some top-down processing enabling reproducibility in nanofabrication can also be found.

Further applications are high surface area chemical sensors, mechanical oscillators and piezo-resistive sensors. High aspect ratio pillars with diameters between 50-100 nm could prove useful for core-shell type plasmonic resonators while pillars with sub-10 nm diameters have shown promising light emission characteristics.

SUMMARY

According to a first aspect, a method of fabricating self-aligning electronic components, the method comprising providing a substrate with one or more nanowires on a first side of the substrate and a first conductive layer on a second side of the substrate, coating the substrate and the one or more nanowires with an insulator, and cleaving the coated one or more nanowires to expose a selected length of a non-cleaved nanowire portion and a selected length of a non-cleaved insulator portion.

According to a second aspect, a method of fabricating self-aligning electronic components, the method comprising providing a substrate with one or more nanowires on a first side of the substrate and a first conductive layer on a second side of the substrate, coating the substrate and the one or more nanowires with an insulator, depositing a second conductive layer on the insulator, depositing a dielectric layer on the second conductive layer, and cleaving the coated one or more nanowires to expose a selected length of a non-cleaved nanowire portion and a selected length of a non-cleaved insulator portion.

According to a third aspect, a electronic arrangement comprising a semiconductor substrate, a cleaved semiconductor nanowire on the semiconductor substrate, and an oxide layer partially coating the cleaved semiconductor nanowire and coating the semiconductor substrate, wherein the oxide layer and the cleaved semiconductor nanowire define an uncoated region of the cleaved semiconductor nanowire, an epitaxial material on the uncoated region of the cleaved semiconductor nanowire.

According to a fourth aspect, an electronic arrangement comprising a semiconductor substrate, a cleaved semiconductor nanowire on the semiconductor substrate, an oxide layer partially coating the cleaved semiconductor nanowire and coating the semiconductor substrate, wherein the oxide layer and the cleaved semiconductor nanowire define an uncoated region of the cleaved semiconductor nanowires, a first conductive layer on the oxide layer, a dielectric material on the first conductive layer, and a second conductive layer on the cleaved semiconductor nanowire and the oxide layer.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 2A-2E shows a cross-sectional view of a nanostructure with an end portion of an oxide layer etched back.

FIGS. 3A-3E show fabrication steps of growing a self-aligned heterostructure in accordance with an embodiment of the present disclosure. In particular:

FIG. 3A shows an exemplary cross-sectional view of a nanowire substrate.

FIG. 3B shows an exemplary cross-sectional view of an oxide passivated nanowire.

FIG. 3C shows an exemplary cross-sectional view of a nanostructure being mechanically cleaved.

FIG. 3D shows a cross-sectional view with epitaxial material deposited on the mechanically cleaved surface.

FIG. 3E shows a cross-sectional view with a conductive layer deposited on a topside and a backside on the substrate.

FIGS. 5A-5E show methods of fabricating a self-aligned transistor in accordance with an embodiment of the present disclosure. In particular:

FIG. 5A shows an exemplary cross-sectional view of an oxide passivated nanowire.

FIG. 5B shows an exemplary cross-sectional view of a substrate and the oxide passivated nanowire deposited with a conductive layer and a dielectric layer.

FIG. 5C shows an exemplary cross-sectional view of a nanostructure being mechanically cleaved.

FIG. 5D shows an exemplary cross-sectional view of deposition of a conductive layer on the cleaved nanostructure and substrate, and on the backside of the substrate.

FIG. 5E shows an exemplary cross-sectional view with the topside conductive layer etched back and a backside conductive layer.

DETAILED DESCRIPTION

Methods for fabrication of nanoscale electronic components are described in accordance with various embodiments of the present disclosure. Nanowires can be fabricated, by way of example and not of limitation, by performing standard photolithographic or electron-beam lithographic techniques, self-assembly to prepare masks for arrays, use of lithography to pattern catalysts and bottom-up techniques such as vapor-liquid-solid (VLS) growth instead of etching. For the sake of simplicity, throughout the present disclosure, the term 'nanopillar' intends to indicate a substantially upright nanoscale shaft where the height is much greater than the width (e.g., 5-10 times greater than the width) and can be used interchangeably with the term 'nanowire'. The term 'nanostructure' intends to indicate the nanopillar including any insulator or conductive layer(s) deposited thereon. 'Nanoscale' is defined herein to be any structure between 1 nm and 500 nm in width.

Figure 1:
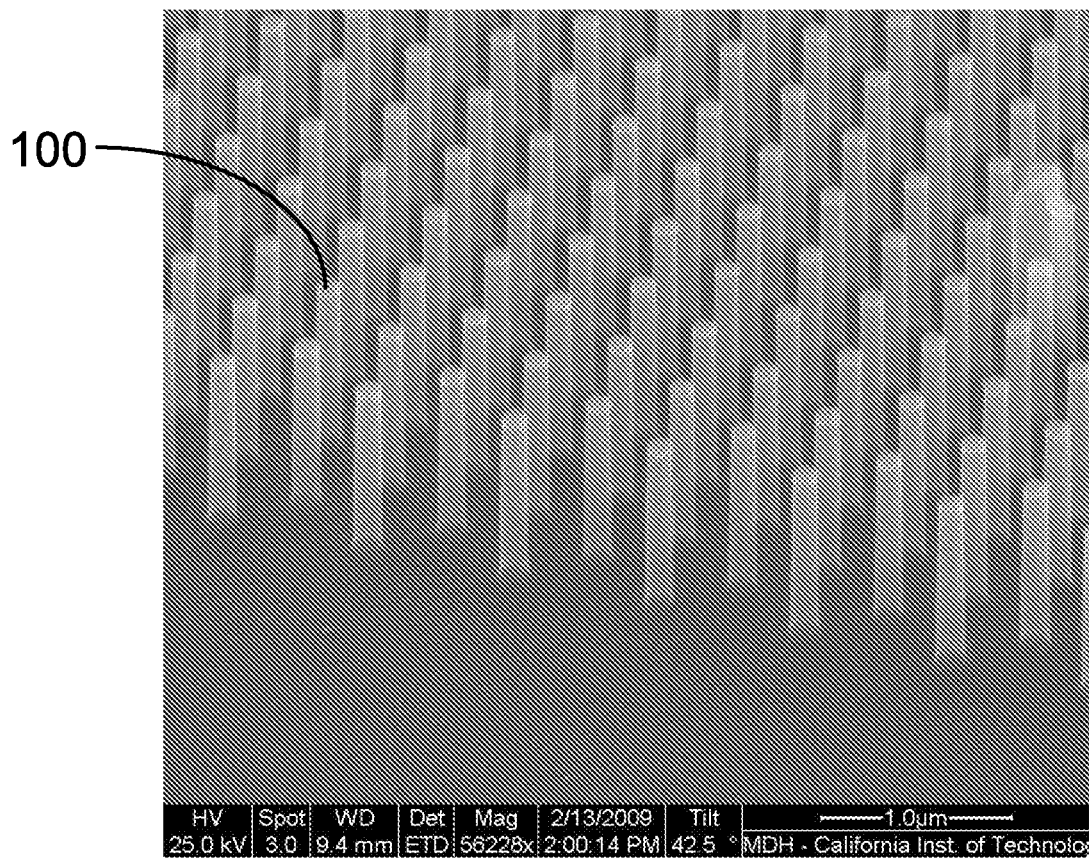
FIG. 1 shows an array of nanostructures.

Photolithography is a process used in microscale fabrication to selectively remove parts of a film or bulk of a substrate. It uses light to transfer a geometric pattern from a photo mask to a light-sensitive chemical called a photo resist on the substrate. Similarly, electron beam lithography is a process where a beam of electrons are scanned in a patterned fashion to the electron-beam resist. This is followed by a series of chemical treatments in a process similar to dark room processing for photography. The photo or electron-beam resists can be utilized as a mask directly, or utilized to pattern a harder mask which can have better resilience as compared to masking directly. Electron-beam resist can be utilized to fabricate a patterned aluminum oxide (alumina) mask, then removing the electron-beam resist and utilizing the patterned alumina during etching. Lithography and highly anisotropic etching enables routine fabrication of 30-50 nm nanostructures (100) in silicon with over 40:1 aspect ratios as shown in FIG. 1. Such structures can be further reduced in diameter by a subsequent thermal oxidation, wherein the oxidation process can be designed to self-terminate such that nanoscale pillars below 10 nm in width can be defined, allowing wide processing latitude.

Field effect transistors (FETs) are generally fabricated using a bottom-up method, planar to the substrate. In a bottom up method, the bottom-most layer is deposited first, followed by precise alignment of subsequent layers, one on top of another until a desired pattern is ultimately achieved. The final patterned arrangement becomes an electronic component, such as transistors (e.g, FETs, MOSFETs, etc). For example, FETs can be fabricated by lithography and the geometry of such FETs allow for charges to be conducted through a channel located below a gate, from source to drain. In such arrangement, the channel is located in-plane to the fabricated surface of the substrate, where the substrate can be a silicon wafer. When a bias is applied to the gate, current is electrostatically controlled between the source and the drain.

In recent applications, as shown for example in U.S. patent application Ser. No. 12/822,109 filed on Jun. 23, 2010, incorporated herein by reference in its entirety, vertical methods for fabricating such FETs are described. Controlling the oxidation process can produce strained silicon nanowires used in the fabrication of the FETs. In such vertical geometry, a nanowire is grown, oxidized, and the circumference is coated by a gate electrode.

FIGS. 3A-3E show various steps of fabricating a semiconductor arrangement involving a self-aligning heterostructure in accordance with the present disclosure. The term 'self-aligned' as used herein intends to indicate alignment that occurs automatically, without relying on an operator's skill or accuracy of a machine to accomplish the alignment. A person skilled in the art will understand that the number of steps involved is only indicative and that the process can occur in more or fewer steps according to the various embodiments.

FIG. 3A is a cross-sectional view of a patterned, or etched substrate (310) comprising a substantially vertical nanopillar (320). By way of example and not of limitation, the substrate (310) and the nanopillar (320) are made of silicon (Si). An example method of fabricating such nanopillars is described in U.S. patent application Ser. No. 12/824,128 filed on Jun. 25, 2010 and U.S. patent application Ser. No. 12/711,992 filed on Feb. 24, 2010, both incorporated herein by reference in their entireties. As an alternative to this embodiment, the vertical nanopillar can be fabricated on silicon-on-insulator (SOI) instead of bulk silicon structure.

FIG. 3B is a further cross-sectional view of the substrate (310) and the nanopillar (320) covered by an insulator, which can be an oxide layer (330), e.g., silicon dioxide ($SiO_2$) or other dielectric. The oxidation process can expand the silicon lattice by approximately 40% to incorporate oxygen. Such expansion leaves the adjacent un-oxidized portion of the silicon under tensile strain. In nanowires, such strain can cause the oxidation process to automatically stop, ultimately resulting in a stable nanoscale tensile-strained silicon core with a silicon dioxide shell. Exposing the embedded silicon to very high strain (e.g., 2.5-3.0%) enhances the ability of such device to efficiently emit light which can be utilized in, for example, opto-electronic switching.

U.S. patent application Ser. No. 12/822,109 filed on Jun. 23, 2010, also incorporated herein by reference in its entirety, describes methods to remove a portion of the oxide from the nanostructure to expose the silicon nanowire located below, by first protecting portions of the nanostructure and the oxide layer on the planar portion of the substrate with some dielectric material, e.g., photoresist, and then stripping away the oxide on the top end portion of the nanowire using methods such as etching.

An alternative method of exposing the nanostructure is shown as a cross-sectional view in FIG. 3C, by mechanically cleaving (340) or mechanically polishing a portion of the nanostructure (360) to reveal a previously unexposed non-removed portion (350) of the nanostructure. Mechanical cleaving results in a precise, clean cut of the nanostructure with minimal difficulty relative to the etching methods previously described.

Figure 4:
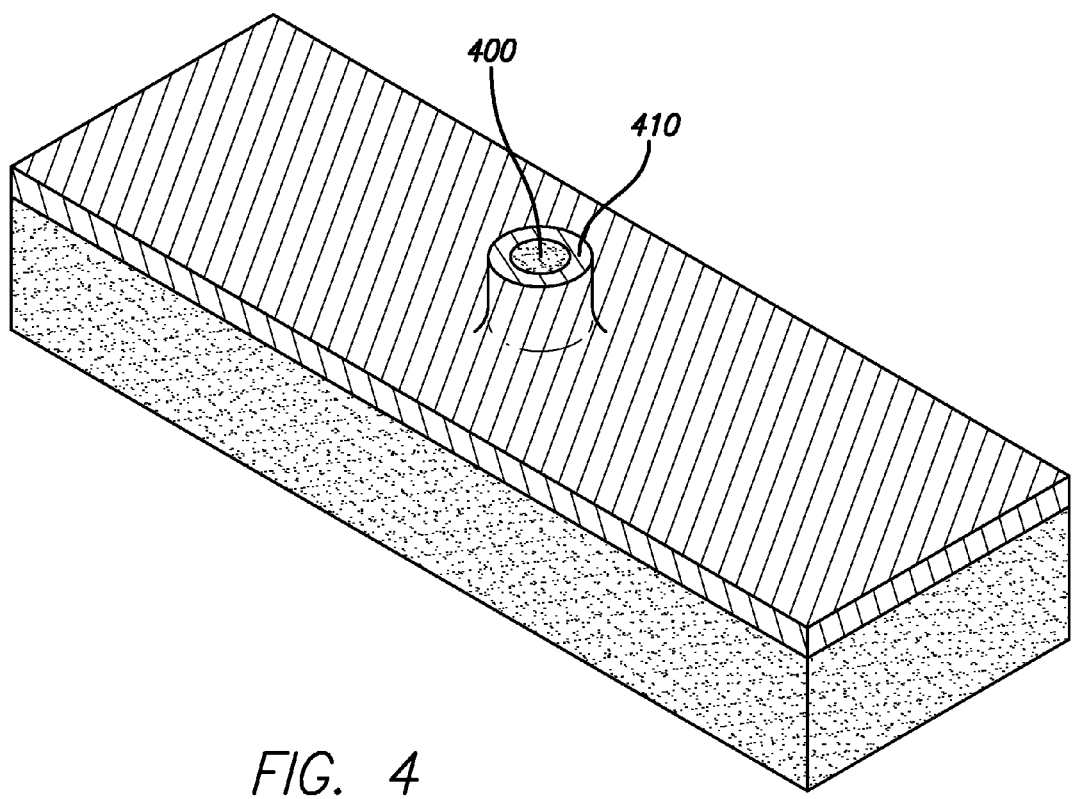
FIG. 4 shows an exemplary perspective view of a cleaved nanostructure on a substrate.

Once the nanostructure is cleaved, a single crystal current aperture (370) (400) surrounded by silicon dioxide (372) (410) is exposed, shown as a cross-sectional view in FIG. 3D and in a perspective view from the top in FIG. 4. Since the aperture is based on the diameter of the silicon nanowire, the aperture size is controlled by the lithographic pattern during the fabrication of the nanowire, and the temperature used during the oxidation process. By fabricating high aspect ratio nanostructures as described by way of example and not of limitation in U.S. patent application Ser. No. 12/711,992 filed on Feb. 24, 2010, U.S. patent application Ser. No. 12/712,097 filed on Feb. 24, 2010, and U.S. patent application Ser. No. 12/824,128 filed on Jun. 25, 2010, circular nano-apertures and sub-nano-apertures with diameters in the range of approximately 5 nm can be made. It is to be noted however, that the diameters are not limited to just the 5 nm range and can be larger or smaller.

Epitaxial material (374) (e.g., GaAs, InP, InAs, Ge, or other III-V material) can be grown precisely within the current apertures and on top of the clearly defined, cleaved silicon nanowire aperture surface as shown in FIG. 4 by exploiting the exposed clean silicon aperture (400) as a template for re-growing. Re-growing such epitaxial material on the aperture (400) involves layering of dissimilar lattice structure crystals in nanoscale environment, which ultimately creates quantum dots. For example, the crystal lattice of the nanowire substrate can be a silicon crystal and the re-grown quantum dot can be a GaAs crystal, one on top of another. However, such lattice structures can be grown without fear of defects in the lattice structure since the strain between the silicon and the re-growth material do not build up in the narrow nanoscale aperture. Thus, strain is kept to a minimum and the dimensions of the quantum dots are less than the pseudomorphic distance in any direction.

Accurate re-growing of quantum dots allow for precisely controlled light emission and electronic attributes. Additionally, simple definition of two and three terminal electrical and optoelectronic components can be accomplished on silicon substrates as shown in FIG. 3E.

FIG. 3E shows a cross-sectional view of the cleaved nanostructure with a quantum dot (392), which is then coated with a conductive layer (390) (e.g., gold, silver, copper, etc.). The backside of the substrate can also be coated with a conductive layer (380). Both conductive layers become contacts for the growth aperture arrangement.

The steps described from FIGS. 3A-3E describe methods of fabricating heterostructures on a substrate where the heterostructures are self-aligned. The term 'self-aligned' as used in the present disclosure intends to indicate alignment that occurs automatically, without relying on an operator's skill or preciseness of a machine to accomplish the alignment.

The present disclosure also describes methods for fabricating gate on a silicon nanostructure. However, the nanostructure is fabricated with tight control over gate length by initially fabricating the nanostructure to a length substantially taller than desired, then depositing a precisely controlled protective spacer layer, and subsequently cleaving or polishing the protruding portions of the nanostructure to obtain tightly controlled gate lengths. As a result, the need for precise manual alignment is eliminated as may be required in traditional lithography, thus resulting in gates which are self-aligned. Such fabrication is not limited to the fabrication of FETs but can also be applied to fabrication of other nano-arrangements, by way of example and not of limitation to, light emitting diodes (LEDs), detectors and junctions, on silicon.

FIGS. 5A-5E describe methods of fabricating a FET with self-aligning gates. Self-aligned FETs eliminate the need to rely on the skill of a person or a machine to precisely obtain proper alignment. FIG. 5A shows a cross-sectional view of an oxidized semiconductor nanowire (502), similar to FIG. 3B. FIG. 5B shows a cross-sectional view of a nanostructure where a layer of conductive material (510) is deposited on the surfaces of the nanostructure and the substrate. The conductive layer material can be, by way of example and not of limitation, gold, silver, copper, aluminum or other types of metals. The conductive layer can be deposited by sputtering, whereby the operator can precisely control the thickness of the conductive layer being deposited. Controlling the thickness of the conductive layer can be accomplished with a higher degree of precision as compared to defining lithographic features at nanoscale levels. Therefore, arrangements with greater precision can be fabricated.

Contacts (220) (390) (570) in FIGS. 2E, 3E and 5E, respectively, are often made on the nanowires in order to make them into functional components. One such method for making contacts can be accomplished by air-bridging, whereby polymer is used to planarize the nanowires before stripping off the top oxide with hydrofluoric acid or selective dry etch.

Figure 6:
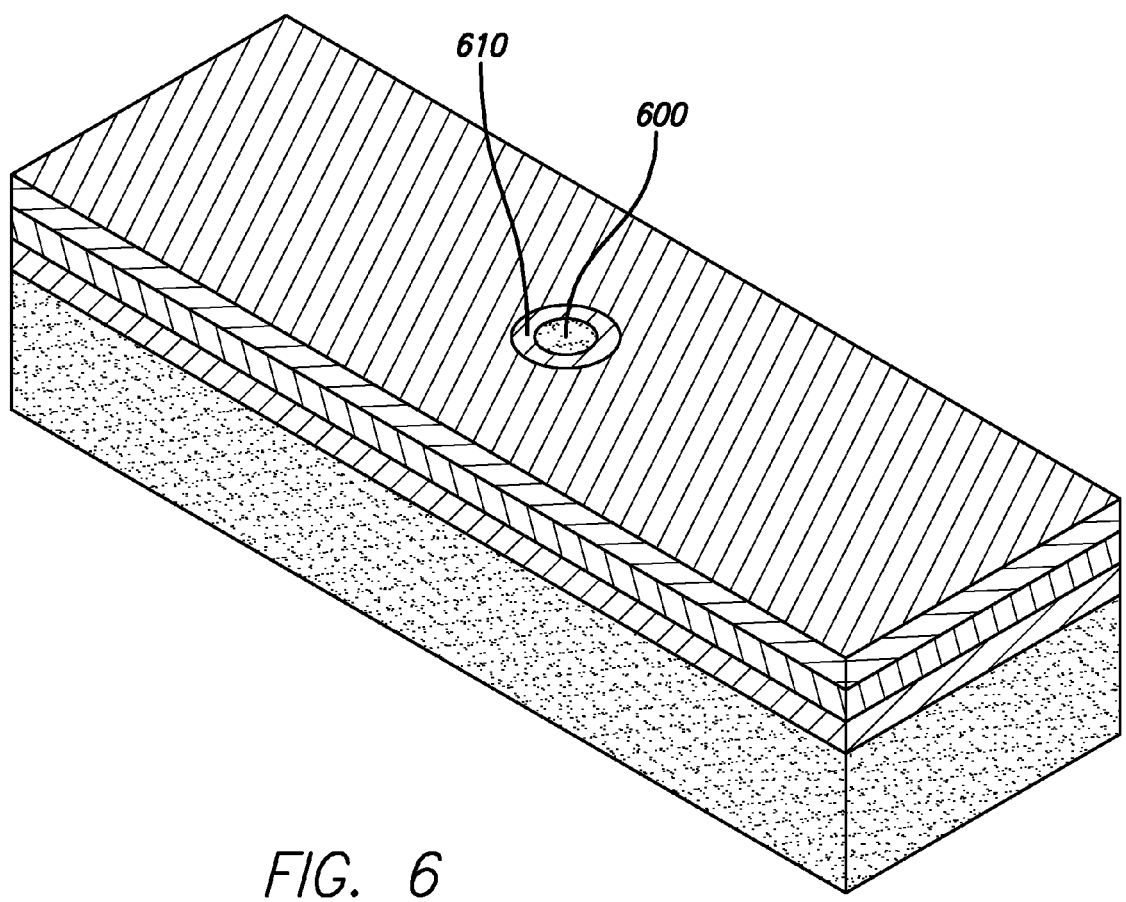
FIG. 6 shows an exemplary perspective view of a cleaved nanostructure on a substrate where the substrate is coated with a conductive and a dielectric layer.

In a further embodiment, the nanostructure is mechanically cleaved (530) as shown with a cross-sectional view in FIG. 5C. As is shown in FIGS. 5D and 5E, a dielectric layer (520) is deposited on the conductive layer (510) on the silicon oxide layer (500) to protect the conductive layer (510) and to electrically isolate the conductive layer (510) from another conductive layer (540) that will be deposited and described in the following paragraphs. Mechanically cleaving (530) the nanostructure just above the protective dielectric layer (520) removes a majority of the top portion of the nanostructure, leaving behind a small nanostructure (560) below the dielectric layer (520), thus exposing the remaining nanowire (600) with the insulator (610) completely surrounding the perimeter of the nanowire as show in FIG. 6 with a perspective top-view.

Cleaving the nanostructure cleaves the gate length of the arrangement, thus the gate length can be precisely fabricated with ease. The gate is essentially 'self-aligned' since the alignment process typically used in lithography is no longer required.

Finally in FIG. 5D, a second conductive layer (540) is deposited on the dielectric (520) and the remaining portion of the nanostructure (560). A backside contact layer (550) is also applied on the opposite side of the semiconductor substrate. The top conductive layer (540) is etched, such that the top conductive layer remains as contact points (570) above the nanostructure (560), as shown in FIG. 5E.

Such arrangement creates a metal-oxide-semiconductor (MOS) structure, which can be, but is not limited to a MOSFET. In case of a FET or a MOSFET, the top contact and the backside contacts become the source and drain, or the drain and source.

Although specific elements such as silicon, oxide, silicon oxide, etc were used to describe the various features and embodiments of the present disclosure, a person or ordinary skill in the art would understand that other elements can be used in place.

The examples set forth above are provided to give those of ordinary skill in the art a complete disclosure and description of how to make and use the embodiments of the methods for fabricating self-aligning arrangements on semiconductors of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

We claim:

1. An electronic arrangement comprising:
   a semiconductor substrate;
   a cleaved semiconductor nanowire on the semiconductor substrate,
   wherein the cleaved semiconductor nanowire comprises at least one of a silicon-on-insulator or a bulk silicon structure,
   an oxide layer partially coating the cleaved semiconductor nanowire and coating the semiconductor substrate, wherein the oxide layer and the cleaved semiconductor nanowire define an uncoated region of the cleaved semiconductor nanowire, and
   an epitaxial material having a different lattice structure or composition from the cleaved semiconductor nanowire on and bounded horizontally in the direction of the substrate surface by the uncoated region of the cleaved semiconductor nanowire, wherein the epitaxial material is a quantum dot.

2. The electronic arrangement of claim 1, further comprising:
   a first conductive layer coating the oxide layer and the epitaxial material; and
   a second conductive layer coating an opposite side of the semiconductor substrate.

3. An electronic arrangement of claim 2, wherein the epitaxial material is bounded vertically in the direction orthogonal to the substrate surface by the first conductive layer.

4. The electronic arrangement of claim 1, wherein the epitaxial material is a III-V material.

5. An electronic arrangement comprising:
   a semiconductor substrate;
   a cleaved semiconductor nanowire on the semiconductor substrate, wherein the cleaved semiconductor nanowire comprises at least one of a silicon-on-insulator or a bulk silicon structure;
   an oxide layer partially coating the cleaved semiconductor nanowire and coating the semiconductor substrate, wherein the oxide layer and the cleaved semiconductor nanowire define an uncoated region of the cleaved semiconductor nanowire;
   a first conductive layer on the oxide layer;
   a dielectric material on the first conductive layer; and
   a second conductive layer on the cleaved semiconductor nanowire and the oxide layer, wherein the first conductive layer is electrically insulated from the second conductive layer by a dielectric material that completely fills an overlapping area between the first conductive layer and the second conductive layer.

6. The electronic arrangement of claim 5, further comprising a third conductive layer coating an opposite side of the semiconductor substrate.

7. The electronic arrangement of claim 5, wherein the electronic arrangement is a field effect transistor (FET).

8. The electronic arrangement of claim 7, wherein the first conductive layer is a gate, and the second and third conductive layers are the source and the drain.

9. The electronic arrangement of claim 6, wherein the electronic arrangement is an optoelectronic device.

10. An electronic arrangement comprising:
    a semiconductor substrate;
    a cleaved semiconductor nanowire on the semiconductor substrate;
    an oxide layer of substantially uniform thickness partially coating the cleaved semiconductor nanowire and coating the semiconductor substrate, wherein the oxide layer and the cleaved semiconductor nanowire define an uncoated region of the cleaved semiconductor nanowire; and
    an epitaxial material having a different lattice structure or composition from the cleaved semiconductor nanowire on and bounded horizontally in the direction of the substrate surface by the uncoated region of the cleaved semiconductor nanowire, wherein the epitaxial material is a quantum dot.

11. An electronic arrangement comprising:
    a semiconductor substrate;
    a cleaved semiconductor nanowire on the semiconductor substrate;
    an oxide layer of substantially uniform thickness partially coating the cleaved semiconductor nanowire and coating the semiconductor substrate, wherein the oxide layer and the cleaved semiconductor nanowire define an uncoated region of the cleaved semiconductor nanowire; and
    an epitaxial material on and bounded horizontally in the direction of the substrate surface by the uncoated region of the cleaved semiconductor nanowire, wherein the epitaxial material is a quantum dot.

* * * * *